US007024612B2

(12) United States Patent
Mitsutani

(10) Patent No.: US 7,024,612 B2
(45) Date of Patent: Apr. 4, 2006

(54) CORRELATION MATRIX LEARNING METHOD AND APPARATUS, AND STORAGE MEDIUM THEREFOR

(75) Inventor: Naoki Mitsutani, Tokyo (JP)

(73) Assignee: NEC Corporation, Tokyo (JP)

( * ) Notice: Subject to any disclaimer, the term of this patent is extended or adjusted under 35 U.S.C. 154(b) by 596 days.

(21) Appl. No.: 09/962,090

(22) Filed: Sep. 26, 2001

(65) Prior Publication Data

US 2002/0062294 A1 May 23, 2002

(30) Foreign Application Priority Data

Sep. 29, 2000 (JP) ...................................... 2000-298093

(51) Int. Cl.
*H03M 13/13* (2006.01)
*H03M 13/37* (2006.01)

(52) U.S. Cl. ...................................................... 714/752
(58) Field of Classification Search ................. 714/752
See application file for complete search history.

(56) References Cited

U.S. PATENT DOCUMENTS

| | | | | |
|---|---|---|---|---|
| 5,148,385 A | | 9/1992 | Frazier | |
| 5,214,745 A | * | 5/1993 | Sutherland | 706/17 |
| 5,398,302 A | * | 3/1995 | Thrift | 706/25 |
| 5,706,402 A | * | 1/1998 | Bell | 706/22 |
| 5,717,825 A | | 2/1998 | Lamblin | |
| 5,802,207 A | * | 9/1998 | Huang | 382/224 |
| 5,903,884 A | * | 5/1999 | Lyon et al. | 706/25 |
| 6,260,036 B1 | * | 7/2001 | Almasi et al. | 707/2 |
| 6,421,467 B1 | * | 7/2002 | Mitra | 382/240 |

FOREIGN PATENT DOCUMENTS

| | | |
|---|---|---|
| EP | 0428449 A2 | 5/1991 |
| FR | 2738098 A1 | 2/1997 |
| WO | WO 95/5640 | 2/1995 |

OTHER PUBLICATIONS

Lippmann, "Neural Nets for Computing", ICASSP–88, Apr. 1988, pp. 1–6.*

Di Stefano et al., "On the use of Neural Networks for Hamming Coding", ISCAS–91, Jun. 1991, pp. 1601–1604.*

Tallini et al., "Neural Nets for Decoding Error–Correcting Codes", Northcon–95, Oct. 1995, pp. 89–94.*

Annauth et al., "Neural Network Decoding of Turbo Codes", IJCNN–99, Jul. 1999, pp. 3336–3341.*

Adelbaki et al., "Random Neural Network Decoder for Error Correcting Codes", IJCNN–99, Jul. 1999, pp. 3241–3245.*

Ortuno, I. et al.; "Error Correcting Neural Networks for Channels with Gaussian Noise"; Proceedings of the International Joint Conference on Neural Networks, (IJCNN); Baltimore, Jun. 7–11, 1992; New York, IEEE, US, vol. 3, Jun. 7, 1992, pp. 295–300.

Ortuno, I. et al.; "Neural Networks As Error Correcting Systems in Digital Communications"; International Workshop on Artificial Neural Networks; XX, XX, Sep. 17, 1991, pp. 409–414.

* cited by examiner

*Primary Examiner*—Stephen M. Baker
(74) *Attorney, Agent, or Firm*—Sughrue Mion, PLLC

(57) ABSTRACT

In an associative matrix training method, calculation between a code word and an associative matrix is performed. The calculation result is compared with a threshold value set for each component on the basis of an original word. The associative matrix is updated on the basis of the comparison result using an update value which changes stepwise. Training of the associative matrix including calculation, comparison, and update is performed for all code words, thereby obtaining an optimum associative matrix for all the code words. An associative matrix training apparatus and storage medium are also disclosed.

8 Claims, 4 Drawing Sheets

CORRELATION MATRIX LEARNING METHOD AND APPARATUS, AND STORAGE MEDIUM THEREFOR

BACKGROUND OF THE INVENTION

The present invention relates to an associative matrix training method and apparatus for a decoding scheme using an associative matrix, and a storage medium therefor and, more particularly, to an associative matrix training method and apparatus in decoding a an error-correcting block code by using an associative matrix.

Conventionally, in decoding an error-correcting code by using an associative matrix, the associative matrix associates an original word before encoding and a code word after encoding. In this decoding scheme, an associative matrix is obtained by training. In an associative matrix training method, a code word and an associative matrix are calculated. The associative matrix calculation is applied to the code word. Each component of the calculation result is compared with a preset threshold value "±TH", for updating the associative matrix. If a component of the original word before encoding is "+1", a threshold value "+TH" is set. Only when the calculation result is smaller than "+TH", each contributing component of the associative matrix is updated by "±ΔW".

If a component of the original word is "0", a threshold value "−TH" is set. Only when the corresponding calculation result is larger than "−TH", each component of the associative matrix is updated by "±ΔW". This associative matrix training is repeated for all the code words and stopped after an appropriate number of cycles, thereby obtaining a trained associative matrix.

In such a conventional associative matrix training method, since the number of times of training at which the associative matrix training should be stopped is unknown, the training is stopped at an appropriate number of times. Hence, a sufficient number of times of training is required more than necessity to learn all code words, and a long time is required for training. Even when a sufficient number of times of training is ensured, for a certain code word, the calculation result only repeatedly increases or decreases from the threshold value "+TH" or "−TH" for a predetermined number of times or more, and associative matrix training is not actually executed for a predetermined number of times or more.

Additionally, since a value much smaller than the threshold value "TH" is set as an update value "ΔW" of an associative matrix, a very large number of training cycles is required for an associative matrix training to converge for all the code words. Furthermore, since no margin for a bit error of "±TH" is ensured for code words whose calculation results repeatedly increase or decrease within the threshold values "+TH" and "−TH", the error rate changes depending on the code word.

SUMMARY OF THE INVENTION

It is an object of the present invention to provide an associative matrix training method and apparatus capable of quickly converging training and a storage medium therefor.

It is another object of the present invention to provide an associative matrix training method and apparatus capable of obtaining an optimum associative matrix for all code words and a storage medium therefor.

In order to achieve the above objects, according to the present invention, there is provided an associative matrix training method of obtaining an optimum associative matrix by training for an associative matrix in a decoding scheme of obtaining an original word from a code word, comprising the steps of performing calculations on the code word using the associative matrix, comparing a calculation result with a threshold value set for each corresponding component on the basis of the original word, updating the associative matrix on the basis of a comparison result using an update value which changes stepwise, and performing training of the associative matrix including calculation, comparison, and update for all code words, thereby obtaining an optimum associative matrix for all the code words.

DESCRIPTION OF THE PREFERRED EMBODIMENT

The present invention will be described below in detail with reference to the accompanying drawings.

Figure 1:
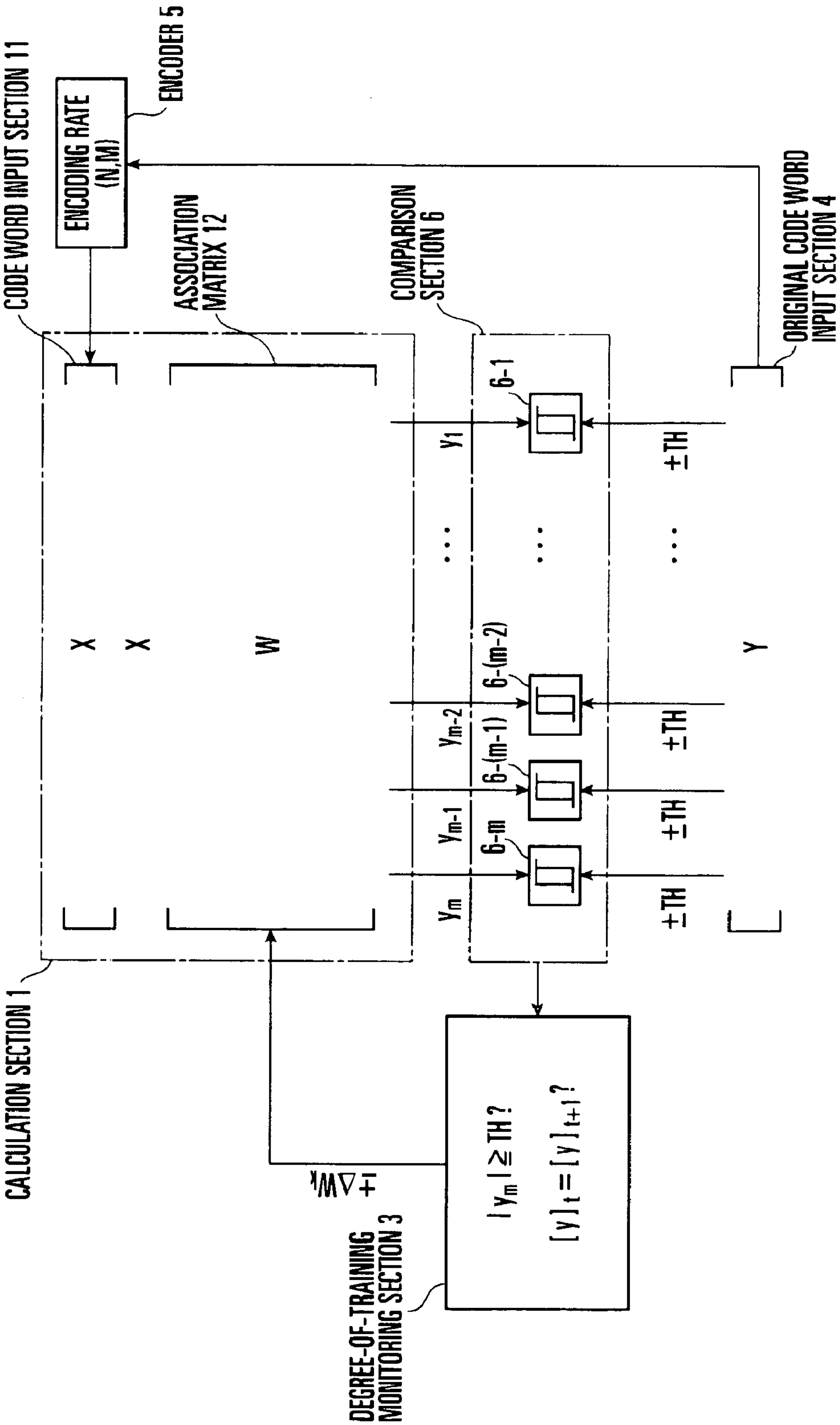
FIG. 1 is a block diagram of an associative matrix training apparatus according to an embodiment of the present invention.

FIG. 1 shows an associative matrix training apparatus according to an embodiment of the present invention. The associative matrix training apparatus shown in FIG. 1 comprises an original word input section 4 for inputting an M-bit original word Y, a code word input section 11 for inputting a block-encoded N-bit code word X with an encoding rate (N,M), a calculation section 1 for calculating the product of the code word X input to the code word input section 11 and an N (rows) ×M (columns) associative matrix 12 and outputting calculation results of M columns, a comparison section 6 having M comparison circuits 6-l to 6-m for comparing the calculation results y of M columns, which are output from the calculation section 1, with threshold values set on the basis of the respective components of the original word Y, and a degree-of-training monitoring section 3 for monitoring comparison results from the comparison circuits 6-l to 6-m of the comparison section 6 and setting an update value "$\Delta W_K$" of the associative matrix 12, which changes stepwise in accordance with the comparison results. The M-bit original word Y input to the original word input section 4 is encoded to the N-bit code word X by an encoder 5 and then input to the code word input section 11.

Figure 2A:
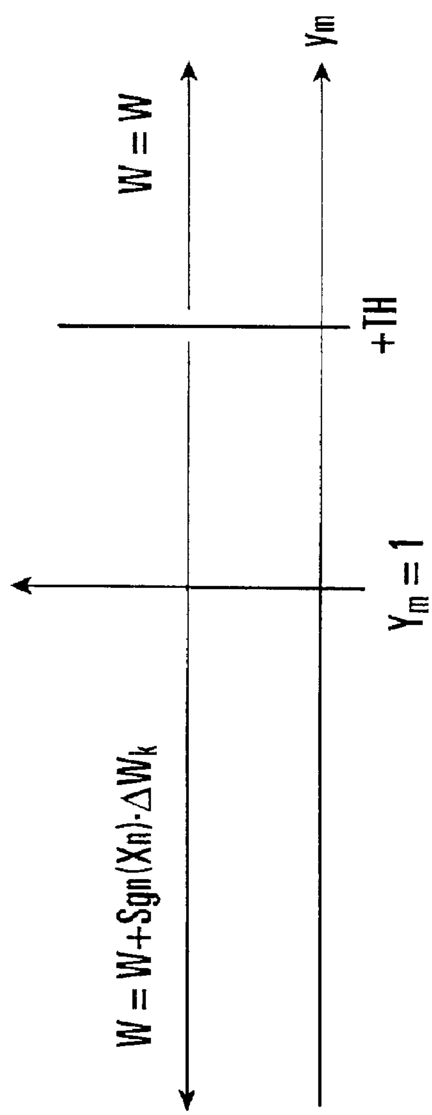
FIGS. 2(A) and 2(B) is a view for explaining a correlation matrix learning rule in the correlation matrix learning apparatus shown in FIG. 1.
Figure 2B:
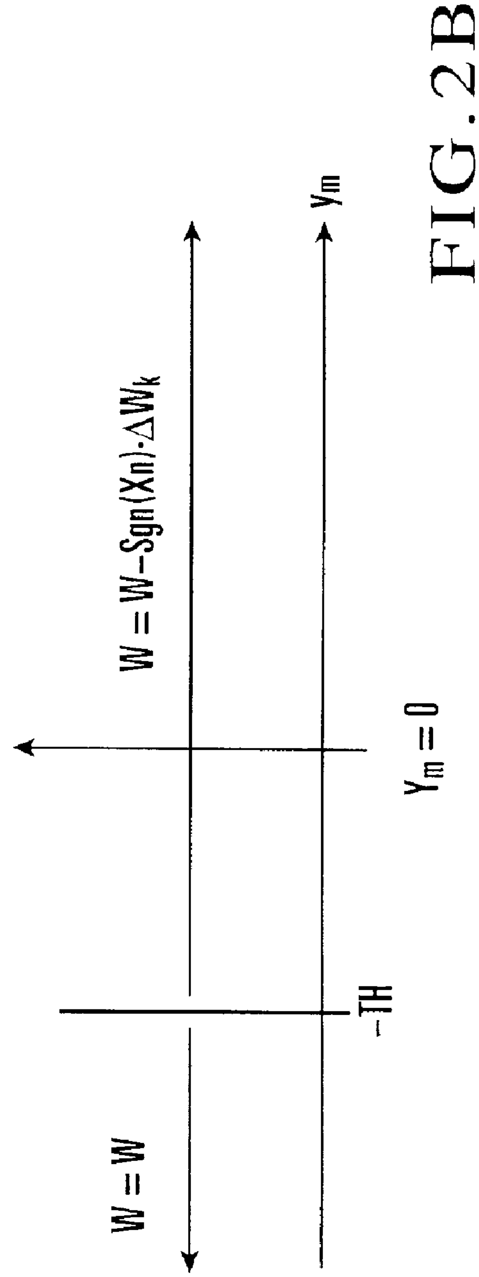

The operation of the associative matrix training apparatus having the above arrangement will be described next with reference to FIGS. 2 to 4. An associative matrix W is defined by a training rule that is predetermined from the calculation results y of the code word X and associative matrix W using the original word Y serving as a desired signal.

Figure 4:
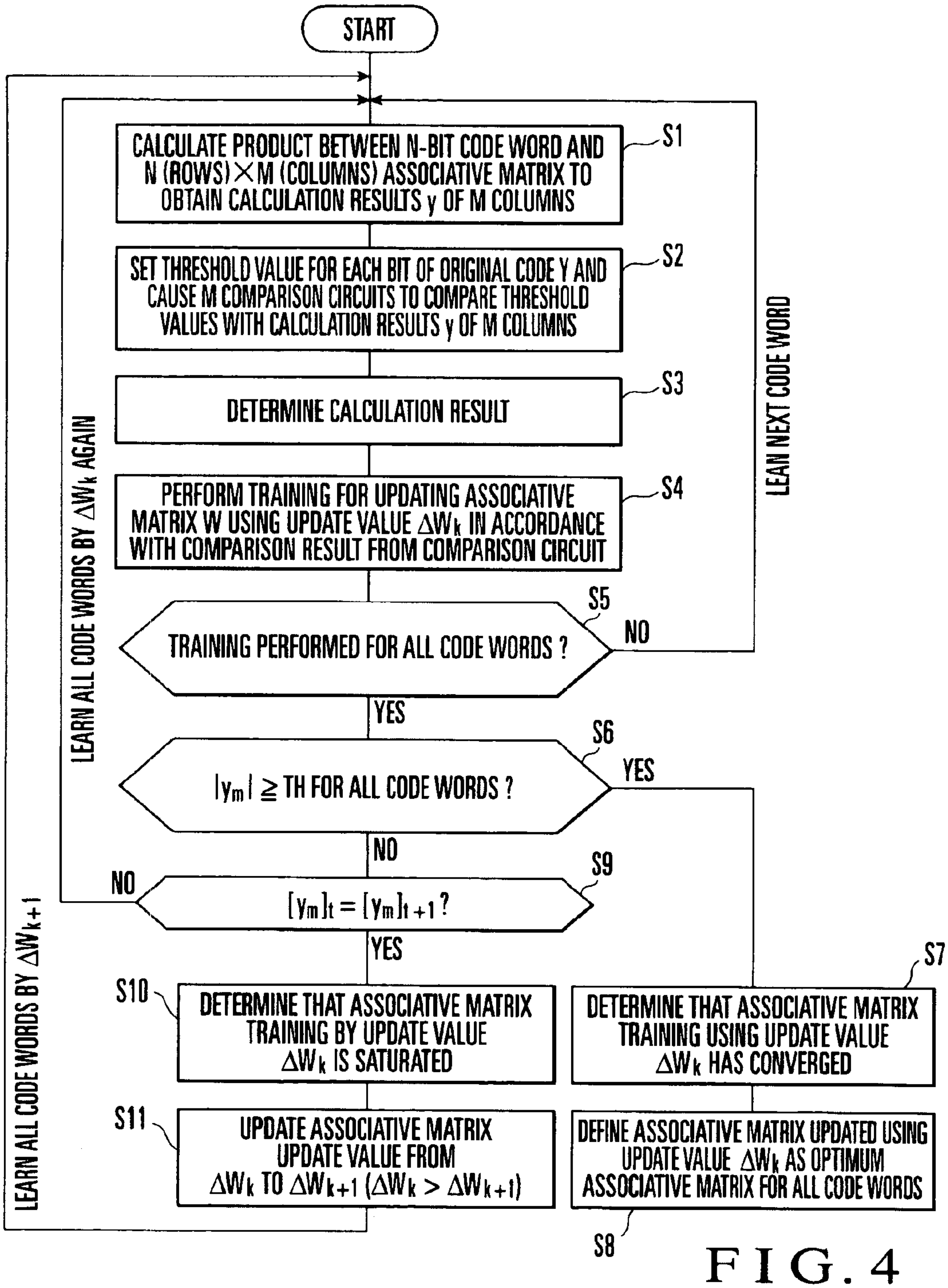
FIG. 4 is a flow chart showing the operation of the associative matrix training apparatus shown in FIG. 1.

Referring to the flow chart shown in FIG. 4, first, the M-bit original word Y is input to the original word input section 4. The encoder 5 executes block-encoding with an encoding rate (N,M) for the original word Y input to the original word input section 4 and outputs the encoded N-bit code word X to the code word input section 11. The calculation section 1 calculates the product between the code word X input to the code word input section 11 and the N (rows)×M (columns) associative matrix W and outputs the calculation results y to the comparison section 6 (step S1).

The comparison section 6 sets a threshold value for each bit of the original word Y input to the original word input section 4 and compares the calculation results y from the calculation section 1 with the respective set threshold values (step S2). In setting a threshold value by the comparison section 6, as shown in FIG. 2, when each bit of the original word Y is "1", "+TH" is set as a threshold value. On the other hand, when each bit of the original word Y is "0", "−TH" is set as a threshold value.

When a bit of the original word Y is "1", and the calculation result y input to the comparison section 6 is equal to or more than "+TH", the associative matrix W is not updated. If the calculation result y is smaller than "+TH", the associative matrix W is updated by "±$\Delta W_K$". When a bit of the original word Y is "0", and the calculation result y is equal to or less than "−TH", the associative matrix W is not updated. If the calculation result y is larger than "−TH", the associative matrix W is updated by "$\Delta W_K$" (steps S3 and S4).

More specifically, when a bit $Y_m$ of the original word Y is "1", a threshold value "+TH" is set in the comparison circuit 6-m. At this time, if an input $y_m$, to the comparison circuit 6-m is equal to or more than "+TH", the associative matrix W is not updated. However, if the input $y_m$ is smaller than "+TH", an associative matrix $W_m$ is updated in the following way.

$$W_{n,m} = W_{n,m} + \mathrm{Sgn}(X_n)\cdot\Delta W_{\underline{K}}$$

$$W_{n-1,m} = W_{n-1,m} + \mathrm{Sgn}(X_{n-1})\cdot\Delta W_K$$

$$\vdots$$

$$W_{1,m} = W_{1,m} + \mathrm{Sgn}(X_1)\cdot\Delta W_K$$

On the other hand, when the bit $Y_m$ of the original word Y is "0", a threshold value "−TH" is set in the comparison circuit 6-m. At this time, if the input $y_m$ to the comparison circuit 6-m is equal to or less than "−TH", the associative matrix W is not updated. However, if the input $y_m$ is larger than "−TH", the associative matrix $W_m$ is updated in the following way.

$$W_{n,m} = W_{n,m} - \mathrm{Sgn}(X_n)\cdot\Delta W_K$$

$$W_{n-1,m} = W_{n-1,m} - \mathrm{Sgn}(X_{n-1})\cdot\Delta W_K$$

$$\vdots$$

$$W_{1,m} = W_{1,m} - \mathrm{Sgn}(X_1)\cdot\Delta W_K$$

However, when each component $[X_n, X_{n-1}, X_{n-2}\ldots, X_2, X_1]$ of the block-encoded code word X is represented by a binary value "1" or "0", calculation is performed by replacing "0" with "−1". Note that $\mathrm{Sgn}(X_n)$ represents the sign (±) of $X_n$.

Figure 3:
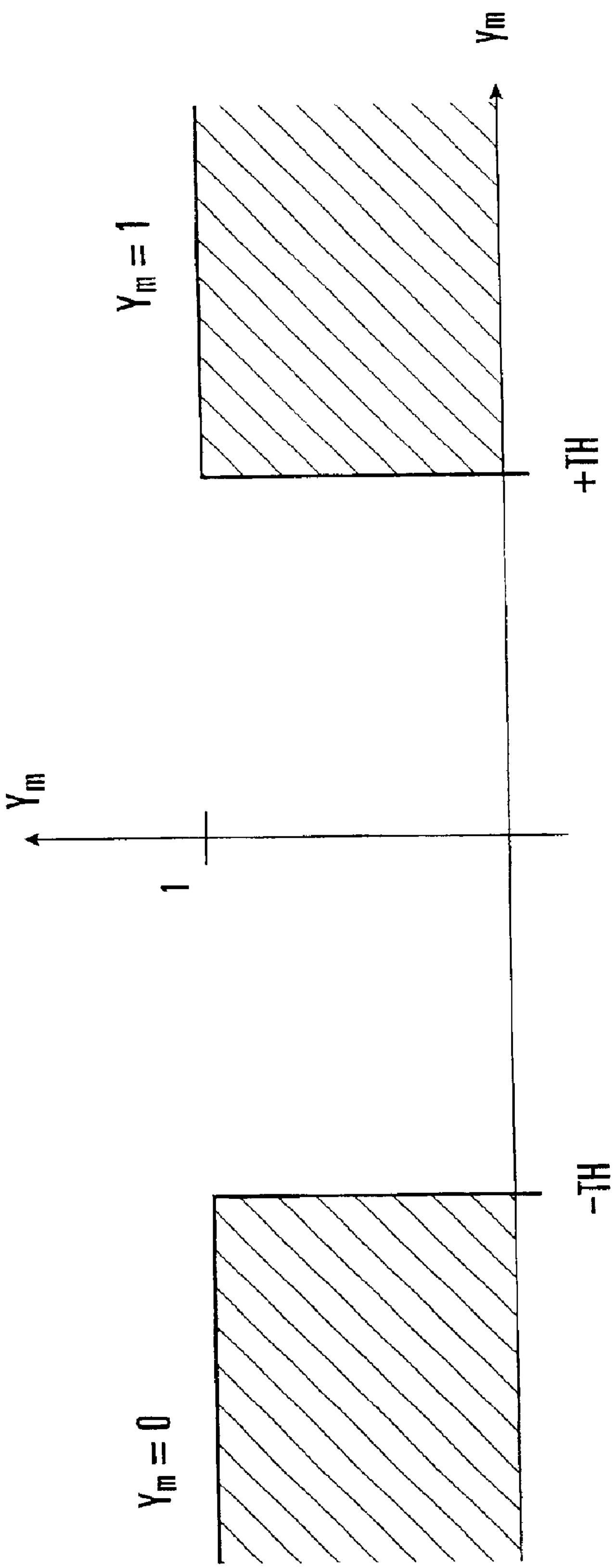
FIG. 3 is a view for explaining the range of calculation result input values to a comparison section when associative matrix training converges in the associative matrix training apparatus shown in FIG. 1.

The degree-of-training monitoring section 3 monitors whether the values of the calculation results y input to the comparison section 6 satisfy $|y_m| \geqq TH$ shown in FIG. 3 for all the code words (step S6). The degree-of-training monitoring section 3 also monitors whether the values of all the M components have changed after training of one cycle. After the associative matrix W is learned by updating the associative matrix W by "$\Delta W_K$" for code words, and the values y of the calculation results in training the code words at that time satisfy $|y_m| \geqq TH$ shown in FIG. 3, it is determined that the degree of training of the associative matrix W with the update value "$\Delta W_K$", has converged, and the associative matrix W to be used for decoding is obtained (steps S7 and S8).

On the other hand, if it is determined in step S6 that the values of the calculation results y do not satisfy the condition shown in FIG. 3 for all the code words, it is monitored whether a value $[y]_{t+1}$ in training of that cycle is equal to or different from a value $[y]_t$ in training of the preceding cycle, i.e., whether $[y]_t=[y]_{t+1}$ (step S9). If the values of the calculation results y for all the code words are not different from the values in training of the preceding cycle, i.e., $[y]_t=[y]_{t+1}$, it is determined that the degree of training of the associative matrix W with the update value "$\Delta W_K$" is saturated (step S10), and the update value of the associative matrix W is updated from "$\Delta W_K$" to "$\Delta W_{K+1}$" (step 11). After that, the flow returns to step S1 to repeat processing from step S1 using the updated update value "$\Delta W_{K+1}$".

If it is determined in step S9 that $[y]_t \neq [y]_{t+1}$, the flow immediately returns to step S1 to repeat training for all the code words using "$\Delta W_K$" again. Table 1 shows the relationship between the above-described training convergence determination condition and the associative matrix update value.

TABLE 1

| | $[y_m]_t = [y_m]_{t+1}$ | $[y_m]_t \neq [y_m]_{t+1}$ |
|---|---|---|
| $\lvert y_m\rvert \geqq TH$ | Converge | Converge |
| $\lvert y_m\rvert < TH$ | $\Delta W_K \rightarrow \Delta W_{K+1}$ | $\Delta W_K$ |

When the associative matrix W is learned for all the code words X, the associative matrix W that is optimum for the input value to the comparison section 6 to satisfy the value shown in FIG. 3 can be obtained by a minimum number of times of training.

The processing shown in the flow chart of FIG. 4 is stored in a storage medium such as a floppy disk, DC-ROM, magnetooptical disk, RAM, or ROM as an associative matrix training program. When the associative matrix training program stored in such a storage medium is read out and executed by a computer through a drive device, convergence in associative matrix training in obtaining, by training, an associative matrix optimum for a decoding scheme of obtaining an original word from a code word can be made faster, and an associative matrix optimum for all code words can be established.

As described above, according to this embodiment, when the values of the calculation results y do not satisfy the relationship shown in FIG. 3 for all code words, and the values of the calculation results y do not different from those in training of the preceding cycle, the degree-of-training monitoring section 3 determines that the degree of training of the associative matrix by the update value at that time is saturated, and the associative matrix update value is changed stepwise. More specifically, the update value of the associative matrix W is set to "$\Delta W_0$" for training of the first cycle. As the training progresses, the update value is changed in a direction in which the update value converges to zero, like "$\Delta W_1, \Delta W_2, \Delta W_3, \ldots, \Delta W_K, \Delta W_{K+1}, \ldots$" (TH) $\Delta W_0 > \Delta W_1 > \Delta W_2 > \Delta W_3 > \ldots \Delta W_K > \Delta W_{K+1} > \ldots > 0$). In addition, as the training progresses, the update value is gradually decreased, thereby changing the update value "$\Delta W_K$" stepwise as the training progresses.

If the values of the calculation results y satisfy the relationship shown in FIG. 3 for all code words, it is determined that the degree of training by the update value at that time has converged, and update of the associative matrix is ended. For this reason, an associative matrix training method and apparatus capable of obtaining, by a minimum number of times of training, an optimum associative matrix W for an associative matrix in a decoding scheme of decoding a block code using an associative matrix, and a storage medium therefor can be provided.

As has been described above, according to the present invention, on the basis of a comparison result obtained by comparing the calculation result of a code word and an associative matrix with a threshold value set for each component on the basis of an original word, the associative matrix is updated using an update value which changes stepwise, training based on the updated associative matrix is executed for all the code words, and the associative matrix update value is changed stepwise and, more particularly, changed in a direction in which the update value converges to zero as the training progresses. With this arrangement, convergence of associative matrix training can be made faster, and an associative matrix optimum for all code words can be established.

In addition, the degree of training of an associative matrix is monitored, the update value is changed stepwise when the degree of training is saturated, and update of the associative matrix is ended when the degree of training has converged. Hence, training more than necessity need not be executed, convergence of associative matrix training can be made faster, and an associative matrix optimum for all code words can be established.

What is claimed is:

1. An associative matrix training method of obtaining an optimum associative matrix by training for an associative matrix in a decoding scheme of obtaining an original word from a code word, comprising the steps of:

performing calculation between the code word and the associative matrix;

comparing a calculation result with a threshold value set for each component on the basis of the original word;

updating the associative matrix on the basis of a comparison result using an update value which changes stepwise; and performing training of the associative matrix including calculation, comparison, and update for all code words, thereby obtaining an optimum associative matrix for all the code words.

2. A method according to claim 1, wherein the update step comprises the step of changing the update value stepwise in a direction in which the update value converges to zero.

3. A method according to claim 1, further comprising the steps of:

monitoring a degree of training of the associative matrix by the update value;

when the degree of training is saturated, changing the update value stepwise;

update the associative matrix using the changed update value; and when the degree of training has converged, ending update of the associative matrix.

4. An associative matrix training apparatus for obtaining an optimum associative matrix by training for an associative matrix in a decoding scheme of obtaining an original word from a code word, comprising:

calculation means for performing calculation between the code word and the associative matrix;

comparison means for comparing a calculation result from said calculation means with a threshold value set for each component on the basis of the original word; and degree of training monitoring means for updating the associative matrix on the basis of a comparison result from said comparison means using an update value which changes stepwise, wherein said degree-of-training monitoring means monitors a degree of training of the associative matrix by the update value for al code words and controls a change in update value in accordance with a state of the degree of training.

5. An apparatus according to claim 4, wherein said degree-of-training monitoring means changes the update value stepwise in a direction in which the update value converges to zero.

6. An apparatus according to claim 4, wherein said degree-of-training monitoring means monitors a degree of training of the associative matrix by the update value, when the degree of training is saturated, changes the update value stepwise and updates the associative matrix using the changed update value, and when the degree of training has converged, ends update of the associative matrix.

7. A computer-readable storage medium which stores an associative matrix training program for obtaining an optimum associative matrix by training for an associative matrix in a decoding scheme of obtaining an original word from a code word, wherein the associative matrix training program comprises the steps of:

performing calculation between the code word and the associative matrix;

comparing a calculation result with a threshold value set for each component on the basis of the original word;

updating the associative matrix on the basis of a comparison result using an update value which changes stepwise; and performing training of the associative matrix including calculation, comparison, and update for all code words, thereby obtaining an optimum associative matrix for all the code words.

8. A medium according to claim 1, wherein the associative matrix training program further comprises the steps of:

monitoring a degree of training of the associative matrix by the update value;

when the degree of training is saturated, changing the update value stepwise;

update the associative matrix using the changed update value; and when the degree of training has converged, ending update of the associative matrix.

* * * * *